(12) United States Patent
Dooley

(10) Patent No.: US 7,227,440 B2
(45) Date of Patent: Jun. 5, 2007

(54) ELECTROMAGNETIC ACTUATOR

(75) Inventor: Kevin Allan Dooley, Mississauga (CA)

(73) Assignee: Pratt & Whitney Canada Corp., Longueuil, Quebec (CA)

( * ) Notice: Subject to any disclaimer, the term of this patent is extended or adjusted under 35 U.S.C. 154(b) by 0 days.

(21) Appl. No.: 11/070,265

(22) Filed: Mar. 3, 2005

(65) Prior Publication Data

US 2006/0197167 A1    Sep. 7, 2006

(51) Int. Cl.
  *H01F 3/00* (2006.01)
  *H01F 7/08* (2006.01)
  *H01F 29/82* (2006.01)
  *H01F 43/00* (2006.01)

(52) U.S. Cl. ............ 335/281; 335/278; 335/255; 335/262; 335/281

(58) Field of Classification Search ........ 257/421–422; 335/255–262, 278–281; 310/26
See application file for complete search history.

(56) References Cited

U.S. PATENT DOCUMENTS

| | | | |
|---|---|---|---|
| 2,843,974 A | 7/1958 | Butterworth et al. | |
| 3,138,749 A | 6/1964 | Stibitz | |
| 3,389,274 A | 6/1968 | Robertson | |
| 3,649,856 A | 3/1972 | O'Neill | |
| 3,902,084 A | 8/1975 | May, Jr. | |
| 3,902,085 A | 8/1975 | Bizzigotti | |
| 4,874,979 A | 10/1989 | Rapp | |
| 4,959,567 A | 9/1990 | Ealey et al. | |
| 5,013,945 A | 5/1991 | Adolfsson | |
| 5,027,027 A | 6/1991 | Orbach et al. | |
| 5,039,894 A | 8/1991 | Teter et al. | |
| 5,148,735 A | 9/1992 | Veletovac | |
| 5,281,875 A | 1/1994 | Kiesewetter et al. | |
| 5,317,223 A | 5/1994 | Kiesewetter et al. | |
| 5,319,257 A | 6/1994 | McIntyre | |
| 5,332,942 A | 7/1994 | Rennex | |
| 5,389,845 A | 2/1995 | Brimhall | |
| 6,040,643 A | 3/2000 | Bruns | |
| 6,246,132 B1 | 6/2001 | Joshi et al. | |
| 6,246,157 B1 | 6/2001 | Oliver et al. | |
| 6,292,077 B1 * | 9/2001 | Kaizuka et al. | ............. 335/281 |
| 6,300,692 B1 | 10/2001 | Joyce | |
| 6,483,208 B2 | 11/2002 | Hooley | |
| 6,501,359 B2 * | 12/2002 | Matsusaka et al. | ......... 335/278 |
| 6,526,864 B2 | 3/2003 | Lindler et al. | |
| 6,556,114 B1 | 4/2003 | Guillemin et al. | |
| 2004/0045148 A1 | 3/2004 | Moler | |

OTHER PUBLICATIONS

International Search Report for corresponding PCT International Application No. PCT/CA2006/000299.
Vranish et al., "Magnetostrictive Direct Drive Rotary Motor Development" IEEE Transactions on Magnetics, vol. 27, Issue 6, Part 2, Nov. 1991, pp. 5355-5357.

* cited by examiner

*Primary Examiner*—Cuong Nguyen
(74) *Attorney, Agent, or Firm*—Ogilvy Renault LLP

(57) ABSTRACT

An electromagnetic actuator comprises an driven member and magnetostrictive elements which change the dimensions thereof when activated or deactivated by selectively applying magnetic flux therein. The driven member is moved in a selected direction when the appropriate elements are activated and deactivated in a controlled manner.

20 Claims, 2 Drawing Sheets

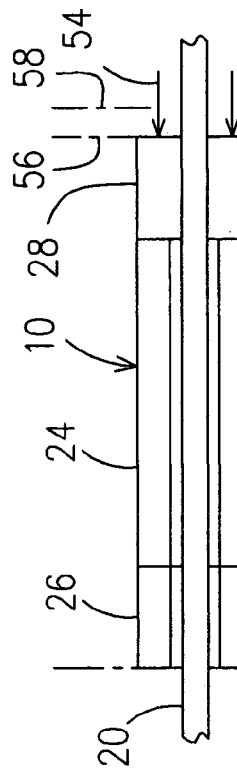
FIG. 2A
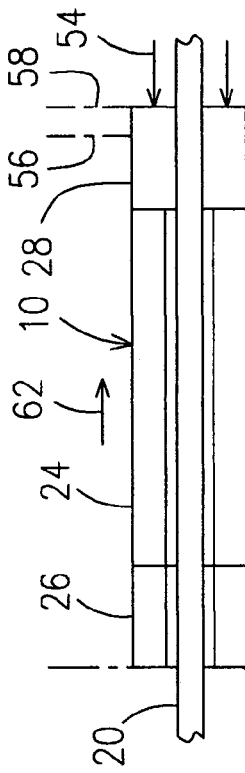
FIG. 2B
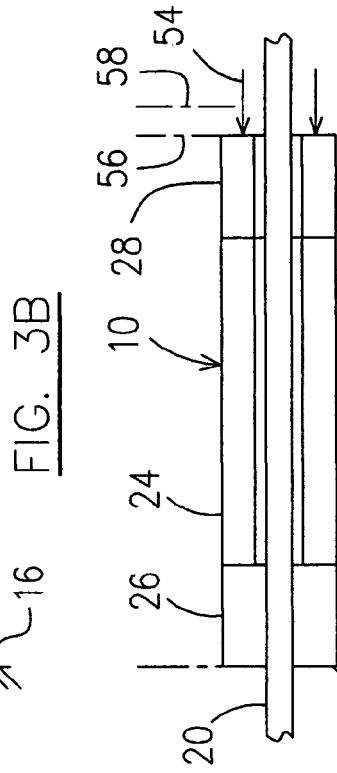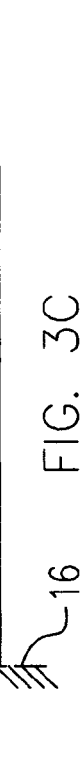
FIG. 2C
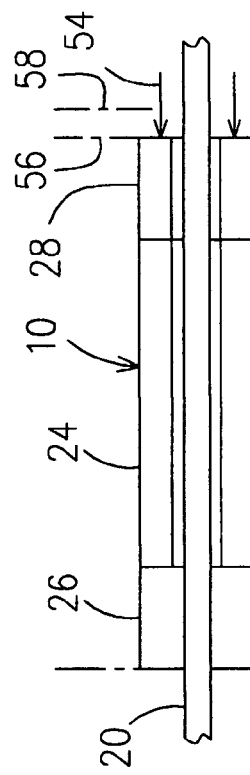
FIG. 3A
FIG. 3B
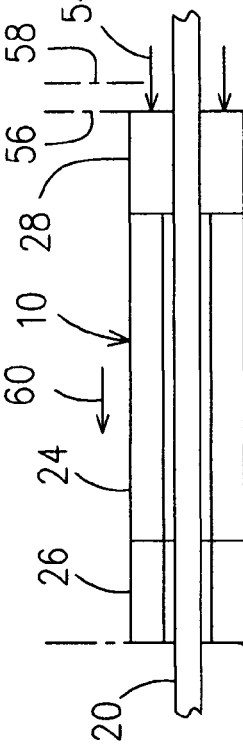
FIG. 3C

ELECTROMAGNETIC ACTUATOR

FIELD OF THE INVENTION

The present invention relates to actuators, more particularly to electromagnetic actuators.

BACKGROUND OF THE INVENTION

Electromagnetic linear actuators of an inchworm type are known and one common solution is achieved by directly moving an actuator armature in small steps using piezoelectric, electromagnetic, or magnetostrictive armature translators. Such translators can move the armature in nanometer increments, and can exert very large forces, because they rely on the stiffness of an expanding or contracting material. For example, electromagnetic linear actuators of an inchworm type are disclosed in U.S. Pat. No. 5,027,027 (Orbach et al.), U.S. Pat. No. 3,902,085 (Bizzigotti) and U.S. Pat. No. 3,902,084 (May, Jr.). The performance efficiency of the actuators disclosed in those prior art documents is limited due to the limitation of the structures thereof.

Improvements to the field of electromagnetic actuators are available, however.

SUMMARY OF THE INVENTION

The object of the present invention is to provide an electromagnetic actuator.

In accordance with one aspect of the present invention, there is provided an electromagnetic actuator which comprises a first member and a second member moveable relative to the first member. The second member includes first end, central and second end elements of a magnetostrictive material, the elements being mounted one to another in series with the central element disposed between the first and second end elements. The second member further includes means for forcing engagement of the first and second end elements with the first member, and means for selectively, magnetostrictively activating the first end, central and second end elements in a controlled manner for permitting the respective first and second end elements to selectively, co-operatively release the forced engagement thereof with the first member while permitting controllably expanding and contracting the central element in a longitudinal direction, thereby causing movement of the first member relative to the second member.

In accordance with another aspect of the present invention, there is provided an electromagnetic actuator which comprises a first member and a second member moveable relative to the first member. The second member includes first end, central and second end elements of a magnetostrictive material mounted one to another in series and at least partially defining a passage for receiving the first member extending therethrough. The central element is disposed between the first and second end elements such that magnetostrictive activation thereof changes the distance between the first and second end elements. The first and second end elements have respective restraining members therearound restraining radial expansion thereof. The first and second end elements is preloaded to apply a clamping action on the first member, the clamping action being releasable by magnetostrictive activation of the first and second end elements. The second member further includes an activation apparatus adapted to controllably magnetostrictively activate the first end, central and second end elements according to a control sequence.

In accordance with a further aspect of the present invention, there is a method of providing a motion between first and second members, the second member including first end, central and second end elements of a magnetostrictive material, being mounted to one another in series with the central element disposed between the first and second end elements, the method comprising: (a) applying a pre-load compression force through the elements while restraining a predetermined surface of the first and second end elements, thereby engaging the first and second end elements with the first member; (b) intermittently producing magnetic flux in the respective first and second end elements to alternately disengage and engage the first and second end elements from and with the first member; (c) intermittently producing magnetic flux in the central element to expand the central element against the compression force and then contract under the compression force, thereby moving one of the first and second end elements reciprocally relative to the other; and (d) controlling the timing of steps (b) and (c) to allow said one of the first and second end elements engaging the first member to move together with the first member relative to the other, either in one direction under a magnetostrictive force when the central element expands or in the other direction under the pre-load compression force when the central element contracts.

The electromagnetic actuator of the present invention advantageously has a very high force capacity in addition to a very controllable action. The stroke length of a linear actuator embodiment of this device is only limited by the length of the driven member.

Other features and advantages of the present invention will be better understood with reference to the invention described hereinafter.

BRIEF DESCRIPTION OF THE DRAWINGS

Reference will be now made to the accompanying drawings in which:

FIGS. 2A–2C show a schematic illustration, showing a sequence of operations of the embodiment of FIG. 1 in one direction; and FIGS. 3A–3C are schematic illustrations, showing a sequence of operations of the embodiment of FIG. 1 in the other direction.

DETAILED DESCRIPTION OF THE PREFERRED EMBODIMENT

Figure 1:
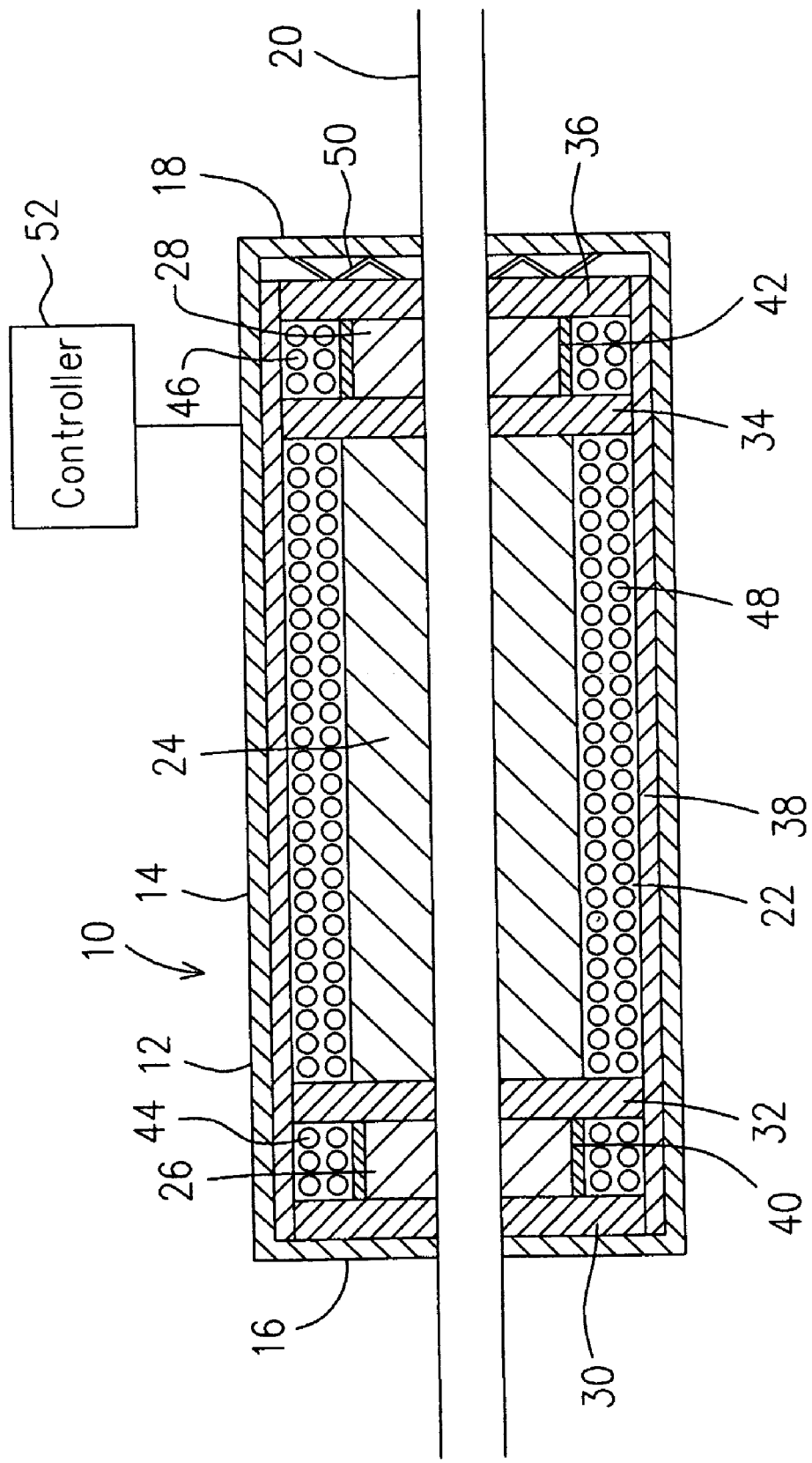
FIG. 1 is a cross-section of an electromagnetic linear actuator according to one embodiment of the present invention.

Referring to FIG. 1, an electromagnetic linear actuator in accordance with one embodiment of the present invention, generally indicated by numeral 10 includes a base structure, preferably a housing 12 having a cylindrical wall 14 axially extending between two opposed end walls 16 and 18. The respective opposed end walls 16, 18 define central openings (not indicated) therein for receiving an elongate driven member, preferably a non-magnetic steel rod 20 extending therethrough, and permitting the rod 20 to axially move in either direction relative to the housing 14. The rod 20 may not be necessarily a rigid steel rod, but may be a section of a flexible but not extendible cable, or other types, which will be further described hereinafter.

A driver assembly 22 is operatively supported within the housing 12 and includes central, first and second end elements of a magnetostrictive material, preferably a central hollow cylinder 24, first and second end hollow cylinders 26, 28. The magnetostrictive material is preferably the compound Terfenol-D which possesses an unusually large magnetostrictive strain. Under its pre-stressed condition, magnetic field applied to a magnetostrictive material will result in a large positive magnetostrictive strain or expansive deformation of the material.

The first end, central and second end hollow cylinders 26, 24 and 28 are positioned in series, each of the cylinders defining an inner passage (not indicated) for receiving the rod 20 extending therethrough. Washers 30, 32, 34 and 36 are provided at the outer end of each of the first and the second end hollow cylinders 26, 28, and provided between the first end hollow cylinders 26 and the central hollow cylinder 24, and between the central hollow cylinder 24 and the second end hollow cylinder 28, respectively. The washers 30, 32, 34 and 36 are made of a magnetic flux permeable material, preferably electromagnetic steel for guiding magnetic flux. A cylinder 38 of a magnetic flux permeable material, preferably electromagnetic steel, is provided within the housing 12, containing the washers 30–36 and the hollow cylinders 24–28 therein. The washers 30–36 have an inner diameter to allow an axial movement thereof relative to the rod 20, and an outer diameter to permit the washers 30–36 to axially move relatively to the steel cylinder 38 while keeping in contact with the steel cylinder 38, thereby forming a closed magnetic flux guiding circuit for each of the first end, central and second end hollow cylinders 26, 24 and 28.

Each of the first and second end hollow cylinders 26, 28 is provided with a restraining ring 40 and 42 which is tightly fitting on the outer periphery of the first and second end hollow cylinders 26, 28 to restrain radial expansion thereof. The restraining rings 40 and 42 are made of non-magnetic metal, preferably made of titanium.

Electromagnetic circuits, such as first and second excitation coils 44, 46 and main extension coil 48 are provided within the steel cylinder 38 and around the first, second end cylinders 26, 28 and the central hollow cylinder 24, respectively for producing magnetic flux in each of the cylinders 26, 24 and 28.

Means for applying an axial compression force, for example a dish plate spring 50 is provided between the washer 36 and the end wall 18 of the housing 12 to urge the entire driver assembly 22 towards and against the end wall 16 of the housing 12, thereby applying the axial compression force through each of the cylinders 26, 24 and 28. Under this axial compression force, the central hollow cylinder 24 radially expands both inwardly and outwardly. The inner passage of the central hollow cylinder 24 has a diameter such that under the radially expanding condition caused by the axial compression force, the central hollow cylinder 24 maintains an axially moveable feature relative to the rod 20. With the restraining rings 40 and 42, the respective first and second end hollow cylinders 26, 28 are prevented from outwardly radially expanding when the axial compression force is applied thereto, and the first and second end hollow cylinders 26, 28 can only expand radially and inwardly, thereby reducing the diameter of the inner passage thereof. The inner passage of the respective first and second end hollow cylinders 26, 28 is properly sized such that a clamping action between the rod 20 and each of the first and second end hollow cylinders 26, 28 occurs when the axial compression force is applied by the spring 50, thereby the relative axial movement between the rod 20 and each of the first and second end hollow cylinders 26, 28 is prohibited. When electric current is introduced to the respective coils 44, 46, magnetic flux is produced in the Terfenol-D of the respective hollow cylinders 26, 28, resulting in a forceful axial expansion thereof against the applied axial compression force by the spring 50. Associated change in diameters of the respective hollow cylinders 26, 28 also occurs, thereby releasing the clamping action between each of the first and second end hollow cylinders 26, 28, to allow the relative axial movement between the rod 20 and each of the first and second end hollow cylinders 26, 28.

It should be noted that under the axial compression force applied by the spring 50, the first end hollow cylinder 26 is restrained by the end wall 16 of the housing 12 while the axial position of the second end hollow cylinder 28 relative to the first end hollow cylinder 26 and the housing 12 is variable. The distance between the first and second end hollow cylinders 26, 28 is determined by the axial dimension of the central hollow cylinder 24. Therefore activating and deactivating the central hollow cylinder 24 by energizing and de-energizing the main extension coil 48 which result in respective axial expansion and contraction of the central hollow cylinder 24, move the second end hollow cylinder 28 in reciprocation. Depending on which of the first and the second end hollow cylinders 26, 28 is activated to release the clamping action on the rod 20, the second end hollow cylinders 28 will move with or without the rod 20. By appropriate timing of the energizing and de-energizing of the respective first and second excitation coils 44, 46 and the main extension coil 48, an inchworm type of motion of the rod 20 in either direction relative to the housing 12 can be achieved. The appropriate timing of the energizing and de-energizing the respective coils 44, 46 and 48 is controlled by a controller 52 which regulates the frequency and the phase of AC current introduced to the individual coils 44, 46 and 48.

Referring to FIGS. 2A–2C, a sequence of operations of the electromagnetic liner actuator 10, as an example, is described. A first step of the operations is to activate the second end hollow cylinder 28 to release the clamping action between this cylinder and the rod 20 while maintaining the deactivating condition of the first end hollow cylinder 26 and the central hollow cylinder 24. Thus, the first end hollow cylinder 26 clamps the rod 20 and the central hollow cylinder 24 maintains its axial dimension under the axial compression force indicated by arrow 54. At this moment the second end hollow cylinder 28 is urged by the axial compression force 54 towards the central hollow cylinder 24, and is maintained in its first (the original) position indicated by line 56, as shown in FIG. 2A. In the next step, the central hollow cylinder 24 is activated to axially expand. The central cylinder 24 can only expand towards the second end hollow cylinder 28 and moves same against the axial compression force 54 to a second position indicated by line 58, because at the other end the central hollow cylinder 24 is restrained from axially expanding by the first end hollow cylinder 26 abutting the end wall 16 of the housing. During the axial motion of the second end hollow cylinder 28 from the first position 56 to the second position 58, the rod 20 remains still because the rod 20 is clamped by the stationary first end hollow cylinder 26, but not the moving second end hollow cylinder 28. When the second end hollow cylinder 28 reaches the second position 58, the second end hollow cylinder 28 is deactivated and thereby clamps the rod 20, as shown in FIG. 2B.

The first end cylinder 26 is activated to release the clamping action thereof on the rod 20 and then the central cylinder is deactivated to contract in its axial dimension to the length as show in FIG. 2A. Thus the axial compression force 54 urges the second end hollow cylinder 28 to return to its first position 56 as shown in FIG. 2C. During the axial motion of the second end hollow cylinder 28 from the second position 58 to the first position 56, the rod 20 is moved together with the second end hollow cylinder 28 in the direction towards the left side as indicated by the arrow 60 in FIG. 2C because of the clamping action between the rod 20 and the second end hollow cylinder 28 which is moving. Therefore, the rod 20 as a driven member completes its first step of an inchworm motion in the direction 60.

The first end hollow cylinder 26 is deactivated to clamp the rod 20 and then the second end hollow cylinder 28 is activated to release the clamping action thereof of the rod 20, as show in FIG. 2A. From now on, the above-described steps are repeated in a controlled manner such that the rod 20 is continuously moving in the inchworm type motion in this direction indicated by arrow 60.

It should be noted that in this motion mode, the rod is moved by the axial compression force 54 which is applied by the spring 50 of FIG. 1. The spring dish plate 50 is adapted provides powerful compression force up to several thousands PSI to overcome an axial load carried by the rod 20.

Referring to FIGS. 3A–3C, a sequence of operations of the electromagnetic linear actuator 10 is described in another motion mode. The operation steps in FIGS. 3A–3C are similar to the operation steps in FIGS. 2A–2C by selectively activating and deactivating the respective first end, central and second end hollow cylinders 26, 24 and 28 such that the central hollow cylinder 24 in cooperation with the applied axial compression force 54 moves the second end hollow cylinder in reciprocation while the respective first and second end cylinders 26, 28 are in cooperation to allow the rod 20 to move together with the second end hollow cylinder 28 in a selected direction.

However, in contrast to the operation steps illustrated in FIGS. 2A–2C, prior to activating the central hollow cylinder 24 to cause its axial expansion, the first end cylinder 26 is activated to release the clamping action thereof on rod 20 while the second end hollow cylinder 28 remains in its deactivated condition to clamp the rod 20. This clamping condition causes the rod 20 to move together with the second end hollow cylinder 28 from its first position 56 to the second position 58 when the second end hollow cylinder 28 is urged by the expansion of the activated central hollow cylinder 24. The direction of such inchworm of the rod 20 is indicated by arrow 62 in FIG. 3B, opposite to the direction of the inchworm motion of rod 20 in FIG. 2C. When the deactivated central cylinder 24 is contracting and the second end hollow cylinder 28 is being urged by the axial compression force 54 to move from the second position 58 to the first position 56, the stationary first end hollow cylinder 26 is deactivated to clamp the rod 20 and the moving second end hollow cylinder 28 is activated to release the clamping action thereof on the rod 20, thereby the rod 20 being locked in its position relative to the linear actuator 10 and being not capable of moving back together with the second end hollow cylinder by the axial compression force 54. The operational steps show in FIGS. 3A–3C are repeated to drive the rod 20 as the driven member in a continued inchworm motion in the direction 62. In this motion mode, the rod 20 is moved by the magnetostrictive force of the central hollow cylinder 24 against the axial compression force 54.

It should be noted that when the rod 20 instead of the housing 12 is affixed to a stationary structure, the housing 12 can move in either direction along rod 20 in operation of the actuator 10.

The magnetostrictive force can reach up to eight thousand PSI for overcome the preload of the axial compression force 54 and an axial workload carried by the rod 20, if sufficient electric current is provided. Similar clamping forces provided by the respective first and second end hollow cylinders 26, 28 are also achievable. The stroke length of this linear actuator 10 is limited only by the length of the rod 20. Nevertheless, each step of the inchworm motion of rod 20 is determined by the change in the axial dimension of the central cylinder 24. In order to provide a more effective inchworm motion of rod 20 the axial dimension of the central cylinder 24 is preferably substantially greater than the axial dimension of the respective first and second end hollow cylinders 26 and 28. This is advantageous in contrast to the prior art in which the central cylinder is affixed at the middle thereof to a stationary structure such that only a half of the axial length thereof is involved in the axial dimension changes in either direction during operation, which limits the performance of the actuators. The electromagnetic linear actuator 10 of the present invention also provides a very fine and very rapid motion of the rod relative to the housing because the respective first end, central and second end hollow cylinders can be activated and deactivated at several thousand times per second.

It should be noted that the driven member which is described in the above embodiment as a steel rod, can alternatively be any flexible but not extendible member, such as a steel cable. For example, the driven member could be a cable of a winch. In a further alternative configuration, the driven member may be curved or even circular if desired. Furthermore, rather than being constrained to grip the driven member by a radially inward squeezing motion, the actuator may be configured to instead expand radially outward (radially inward movement being preferably restrained) to outwardly engage, and thus grip, an externally positioned driven member—that is, the skilled reader will appreciate that, instead of the rod-like driven member described above, a hollow drum-like driven member could surround expandable magnetostrictive elements instead. In such a design, the gripping action of the magnetostrictive elements is activated by magnetic flux rather than a compression force, the means for applying the compression force and the expansion restraining apparatus are therefore not needed and the operation steps will change accordingly.

It should also be noted that when the driven member is attached to a stationary structure, the driving member including the megnetostrictive elements can become a driven member, which extends the present invention to even broader applications.

Still further modifications to the above-described embodiments of the present invention will be apparent to those skilled in the art which do not depart from the principles of the invention described. Therefore, the foregoing description is intended to be exemplary rather than limiting. The invention is intended to be limited solely by the scope of the appended claims.

I claim:

1. An electromagnetic actuator comprising:
   a first member; and
   a second member moveable relative to the first member, the second member including first end, central and second end magnetostrictive elements, the elements mounted one to another in series with the central element disposed between the first and second end elements, the second member further including means for selectively forcing engagement in a radial direction of the first member by the first and second end elements, said means including means for axially compressing the first and second end elements and means for restraining respective radial expansion of the first and second end elements in a direction opposite to said radial direction, and means for magnetostrictively activating the first end, central and second end elements in a controlled manner to alternatingly maintain and release forced engagement of the respective first and second end elements with the first member while controllably expanding and contracting the central element in a longitudinal direction, thereby causing movement of the first member relative to the second member.

2. The electromagnetic actuator as claimed in claim 1 wherein the magnetostrictively activating means comprises electric coils respectively associated with the first end, central and second end elements for selectively producing magnetic flux to magnetostrictively activate the elements in accordance with a control sequence, a position of the second end element being thereby substantially determined by magnetostrictive dimensional changes of the central element in the longitudinal direction.

3. The electromagnetic actuator as claimed in claim 1 wherein the means for compressing comprises a pre-load apparatus adapted to apply a compression force through the first end, central and second end elements in the longitudinal direction, and the means for restraining comprises a restraining apparatus associated with each of the first and second end elements, thereby creating expansion of the respective first and second end elements towards the first member and resulting in engagement of the respective first and second end elements with the first member.

4. The electromagnetic actuator as claimed in claim 2 wherein the respective first and second end elements release the forced engagement with the first member when the magnetic flux is produced in the respective first and second end elements.

5. The electromagnetic actuator as claimed in claim 1 wherein the first member comprises a circle, thereby permitting continuous translation of the first member relative to the second member.

6. An electromagnetic actuator comprising:

a first member; and a second member moveable relative to the first member, the second member including first end, central and second end magnetostrictive elements mounted one to another in series, the first and second end elements configured to grippingly engage the first member the central element disposed between the first and second end elements such that magnetostrictive activation of the central element changes an axial distance between the first and second end elements, the second member including restraining apparatus restraining respective radial expansion of the first and second end elements in a radial direction, the first and second end elements preloaded by a compression apparatus configured to apply an axially-directed compression force to the first and second end elements, the compression apparatus and restraining apparatus co-operating to cause the first and second end magnetostrictive elements to deform radially to apply respective clamping actions on the first member in a direction opposite to said radial direction, the respective clamping actions releasable by magnetostrictive activation of the respective first and second end elements, the second member further including an activation apparatus configured to controllably magnetostrictively respectively activate the first end, central and second end elements according to a control sequence.

7. The electromagnetic actuator as claimed in claim 6 wherein the central, first and second end elements comprise magnetostrictive first, central and second end hollow cylinders defining said passage extending axially therethrough, the central hollow cylinder having an inner dimension greater than an outer dimension of the first member such that the central hollow cylinder is axially moveable under the compression force.

8. The electromagnetic actuator as claimed in claim 7 wherein said restraining members comprise a pair of restraining rings of non-magnetic metal, tightly fitting on an outer periphery of the respective first and second hollow cylinders.

9. The electromagnetic actuator as claimed in claim 6 wherein the first member is rigid and curved.

10. The electromagnetic actuator as claimed in claim 6 wherein the first member is flexible and non-extendable.

11. The electromagnetic actuator as claimed in claim 6 wherein the second member comprises a base support structure for operatively supporting the central, first and second end elements, the first end element being substantially stationary relative to the base support structure.

12. The electromagnetic actuator as claimed in claim 7 wherein the second member comprises a housing having end openings for accommodating the three hollow cylinders and allowing the first member to extend therethrough.

13. The electromagnetic actuator as claimed in claim 12 wherein said activation apparatus comprises electrical coils within the housing and around the respective hollow cylinders for selectively producing magnetic flux in the respective cylinders.

14. The electromagnetic actuator as claimed in claim 13 wherein the second member comprises electromagnetic metal washers positioned at outer ends of the first and second end hollow cylinders, and between the central hollow cylinder and the respective first and second end hollow cylinders for guiding magnetic flux.

15. The electromagnetic actuator as claimed in claim 12 wherein the second member comprises a spring for creating said pre-load, positioned within the housing at one end thereof, applying the compression force through the second end and central hollow cylinders and urging the first end hollow cylinder towards the other end of the housing, thereby axially compressing the first and second end hollow cylinders and resulting in said clamping action.

16. A method of providing a motion between first and second members, the second member including first end, central and second end magnetostrictive mounted to one another in series, the central element disposed between the first and second end elements, the method comprising:

(a) applying a pre-load compression force to the first and end, central and second end elements in a longitudinal direction while restraining radial growth of the first and second end elements, in a radial direction away from the first member, thereby forcing expansion of the respective first and second end magnetostrictive elements in a radial direction towards the first member to grippingly engage the first and second end elements with the first member;

(b) intermittently circulating magnetic flux in the respective first and second end elements to alternately disengage and then grippingly re-engage the first and second end elements from and with the first member;

(c) intermittently circulating magnetic flux in the central element to longitudinally expand the central element against the compression force and then contract under the compression force, thereby moving the first and second end elements relative to the other; and (d) controlling the timing of steps (b) and (c) to allow said one of the first and second end elements engaging the first member to move together with the first member relative to the other of the first and second end elements, either in one direction under a magnetostrictive force when the central element expands or in the other direction under the pre-load compression force when the central element contracts.

17. The method as claimed in claim 16 comprising a step of attaching the first member to a stationary structure for use of the second member as a driven member.

18. The method as claimed in claim 16 comprising a step of attaching the second member to a stationary structure for use of the first member as a driven member.

19. The method as claimed in claim 16 wherein the step (d) is practiced by:
(1) disengaging the second end element from the first member while maintaining the engagement of the first end element with the first member;
(2) expanding the central element against the pre-load compression force to move the second end element from a first position thereof to a second position thereof further away from the first end element;
(3) re-engaging the second end element with the first member at the second position thereof while disengaging the first end element from the first member;
(4) contracting the central element, the second end element together with the engaged first member thereby moving from the second position to the first position under the pre-load compression force;
(5) re-engaging the first end element with the first member; and
(6) repeating steps of (1) to (5) to cause movement of the first member relative to the second member in a direction from the second end element to the first end element.

20. The method as claimed in claim 16 wherein the step (d) is practiced by:
(1) disengaging the first end element from the first member while maintaining the engagement of the second end element with the first member;
(2) expanding the central element against the pre-load compression force to move the second end element together with the engaged first member from a first position of the second end element to a second position of the second end element further away from the first end element;
(3) disengaging the second end element from the first member at the second position thereof while re-engaging the first end element with the first member;
(4) contracting the central element, the second end element thereby moving from the second position thereof to the first position thereof under the pre-load compression force;
(5) re-engaging the second end element with the first member; and
(6) repeating steps of (1) to (5) to cause movement of the first member relative to the second member in a direction from the first end element to the second end element.

* * * * *

UNITED STATES PATENT AND TRADEMARK OFFICE
CERTIFICATE OF CORRECTION

| | |
|---|---|
| PATENT NO. | : 7,227,440 B2 |
| APPLICATION NO. | : 11/070265 |
| DATED | : June 5, 2007 |
| INVENTOR(S) | : Kevin Allan Dooley |

It is certified that error appears in the above-identified patent and that said Letters Patent is hereby corrected as shown below:

Claim 8, column 8, line 13, between "restraining" and "comprise", delete "members" and insert --apparatus--

Signed and Sealed this

Seventh Day of August, 2007

JON W. DUDAS
*Director of the United States Patent and Trademark Office*